United States Patent
McLean et al.

(10) Patent No.: US 9,269,886 B1
(45) Date of Patent: Feb. 23, 2016

(54) FAST STARTUP, MICRO POWER, LOW NOISE PIEZOELECTRIC AMPLIFIER WITH EXTENDED LOW FREQUENCY RESPONSE

(71) Applicant: Meggitt (Maryland), Inc., Germantown, MD (US)

(72) Inventors: Christopher E. McLean, Dillsburg, PA (US); Lei Hsu, Germantown, MD (US)

(73) Assignee: Meggitt (Maryland) Inc., Germantown, MD (US)

( * ) Notice: Subject to any disclaimer, the term of this patent is extended or adjusted under 35 U.S.C. 154(b) by 40 days.

(21) Appl. No.: 14/057,362

(22) Filed: Oct. 18, 2013

Related U.S. Application Data

(60) Provisional application No. 61/715,633, filed on Oct. 18, 2012.

(51) Int. Cl.
*H01L 41/107* (2006.01)

(52) U.S. Cl.
CPC .................................. *H01L 41/107* (2013.01)

(58) Field of Classification Search
CPC .... H01L 41/042; H02N 2/0075; H02N 2/008; H02N 2/06; H02N 2/062; H02N 2/065; H02N 2/14; H02N 2/142; H02N 2/145
USPC .................................................. 310/314, 317
See application file for complete search history.

(56) References Cited

U.S. PATENT DOCUMENTS

| | | | |
|---|---|---|---|
| 2,857,462 A | 10/1958 | Lin | |
| 3,400,284 A | 9/1968 | Elazar | |
| 3,452,287 A | 6/1969 | Busch et al. | |
| 2004/0046484 A1* | 3/2004 | Schiller | 310/317 |
| 2005/0134384 A1* | 6/2005 | Sato | 330/277 |
| 2007/0176516 A1* | 8/2007 | Nagaya et al. | 310/346 |

OTHER PUBLICATIONS

"Using Op Amps as Comparators," Tutorial MT-084, Analog Devices, Inc., 2009, pp. 1-6.
B. Carter, "Op Amp and Comparators—Don't Confuse Them!," Application Report SLOA067, Texas Instruments, Sep. 2001, 13 pages.
"Bolt Power Cells use Linear's LTC3588-1 Piezoelectric Energy Harvesting Conversion Chip to Power Dust Networks' Motes," MicoGen Systems, Inc., Linear Technology Corporation, www.linear.com, Jun. 25, 2013, 3 pages.
"WirelessHART & Internet Protocol Wireless Sensor Networks Achieve Industry's Lowest Power Consumption at Less Than 50μA per Node," Linear Technology Corporation, www.linear.com, Oct. 16, 2012, pp. 1-4.
"Low Voltage Accelerometer, Top Exit Connector/Cable, 25 mV/g," AC312 Series, Connection Technology Center Inc., p. 45.

(Continued)

*Primary Examiner* — Derek Rosenau
(74) *Attorney, Agent, or Firm* — Blank Rome LLP; Peter S. Weissman

(57) ABSTRACT

A circuit combines the features of fast startup with low current, low frequency response, and low noise. With the use of a novel biasing technique, it is possible to operate the piezoelectric crystal at zero DC voltage bias, both throughout the startup phase and during normal operation, by setting both ends of the piezoelectric crystal to the same voltage potential. In this application, the potential is that of the reference voltage. Not having to charge the piezoelectric crystal capacitance reduces the startup time dramatically.

22 Claims, 10 Drawing Sheets

(56) References Cited

OTHER PUBLICATIONS

"Low Cost, Industrial ICP® Accelerometer, Small Size Conveniently Installs into Tight Places," Model 608A11, PCB® Piezotronics, Inc., IMI Sensors, 2004, 2 pages.

"High g Accelerometer, Top Exit Connector/Cable 10mV/g," AC131 Series, Connection Technology Center Inc., p. 13.
"Multi-Purpose Accelerometer, Top Exit Connector/Cable, 100mV/g," AC102 Series, www.ctconline.com, Connection Technology Center Inc., p. 4.
https://en.wikipedia.org/wiki/Comparator, 8 pages.

* cited by examiner

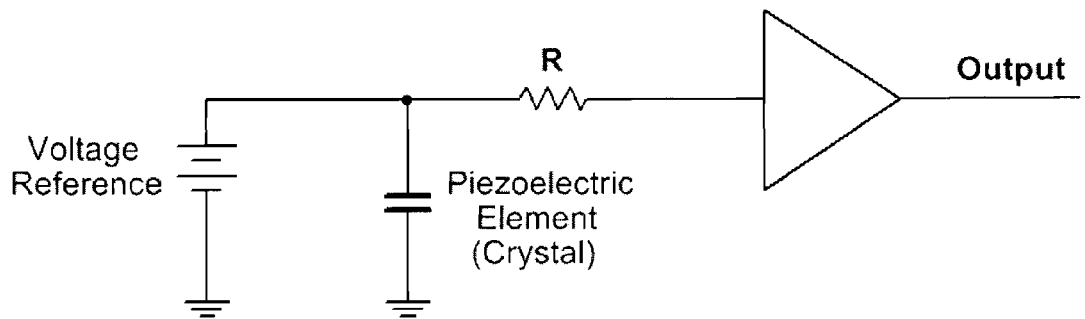
Figure 1(a) – PRIOR ART
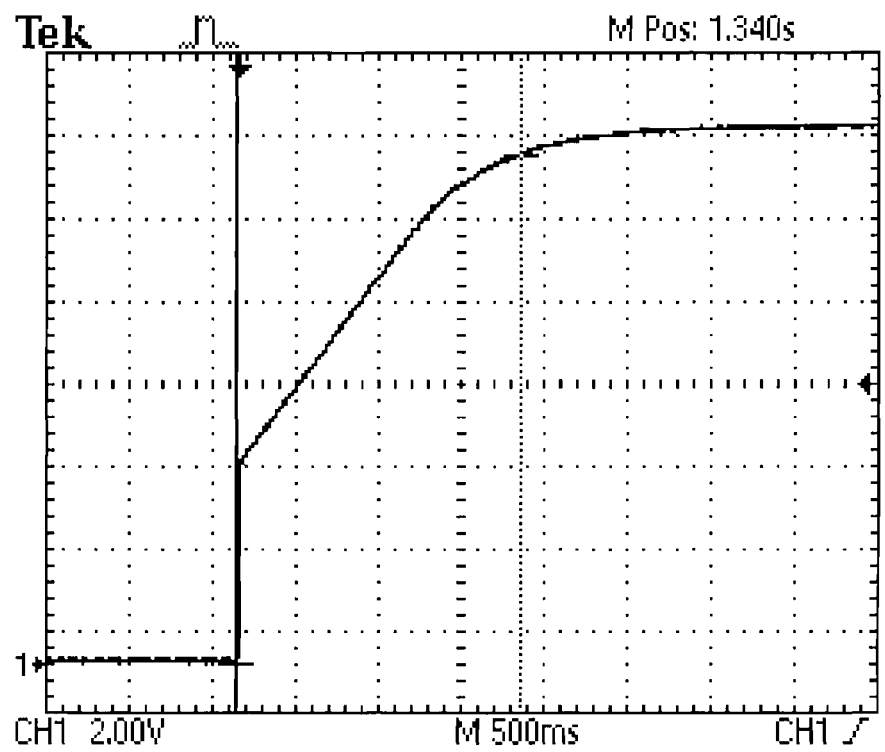
Figure 1(b) – PRIOR ART

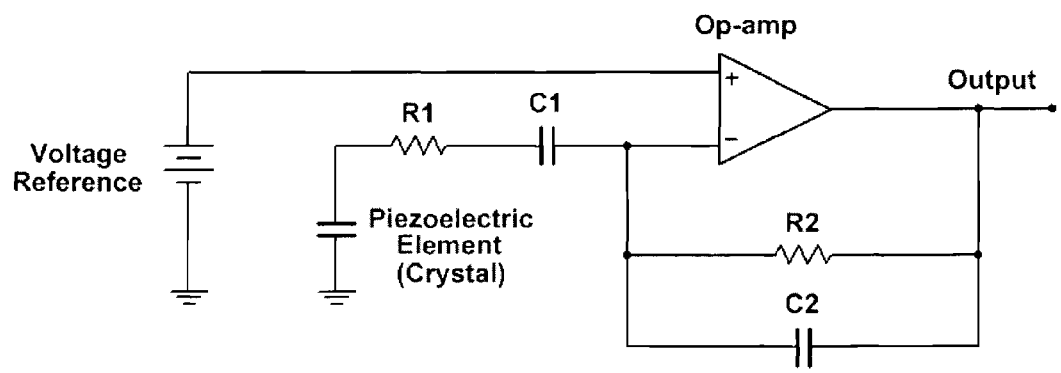
Figure 2(a) – PRIOR ART

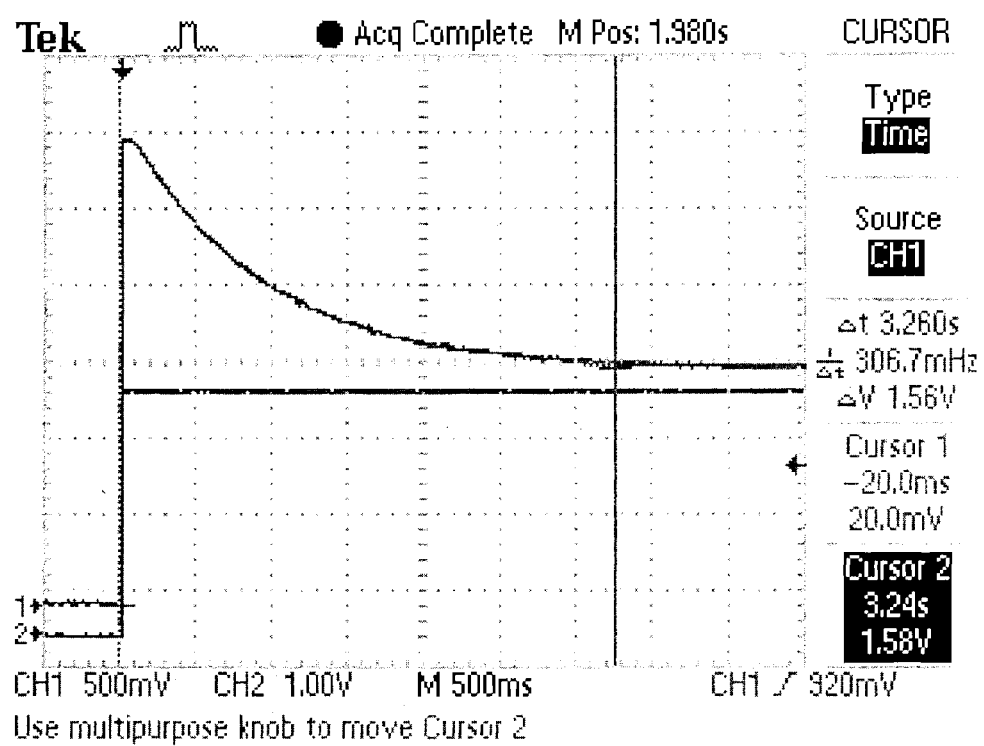
Figure 2(b) – PRIOR ART

| Specifications | Standard | Metric |
|---|---|---|
| Part Number | AC312 | M/AC312 |
| Sensitivity (±10%) | 25 mV/g | |
| Frequency Response (±3dB) | 30-900,000 CPM | 0,5-15000 Hz |
| Frequency Response (±10%) | 60-720,000 CPM | 1,0-12000 Hz |
| Dynamic Range | ± 50 g, peak | |
| Electrical | | |
| Settling Time | <1.0 second | |
| Power Supply Voltage | 3-5 VDC (10%) | |
| Spectral Noise @ 10 Hz | 60 µg/√Hz | |
| Spectral Noise @ 100 Hz | 20 µg/√Hz | |
| Spectral Noise @ 1000 Hz | 5 µg/√Hz | |
| Output Impedance | <100 ohm | |
| Bias Output Voltage | 1.5 V ± 10% | |
| Case Isolation | >10$^8$ ohm | |
| Supply Current | < 20 µA | |

Figure 8 – PRIOR ART

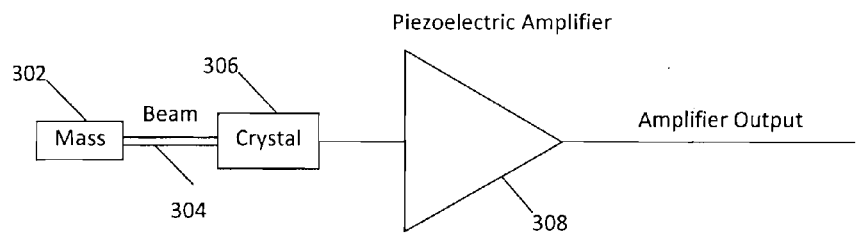

Figure 9

FAST STARTUP, MICRO POWER, LOW NOISE PIEZOELECTRIC AMPLIFIER WITH EXTENDED LOW FREQUENCY RESPONSE

RELATED APPLICATION

This application claims the benefit of U.S. Provisional Application No. 61/715,633, filed Oct. 18, 2012, the entire contents of which are hereby incorporated by reference.

BACKGROUND OF THE INVENTION

1. Field of the Invention

The present invention relates to piezoelectric accelerometers, and more particularly, to a signal conditioning circuit incorporating fast startup, low frequency response and micro power operation.

2. Description of the Prior Art

Piezoelectric sensors are used in many applications, including accelerometers and vibration sensors. Because the piezoelectric element (crystal) is an inherently high impedance device, it is often necessary to buffer or condition the signal generated by the piezoelectric element. A piezoelectric amplifier is an electronic circuit that converts the high impedance output of the crystal to a more usable, low impedance signal.

There are two general approaches used to construct piezoelectric amplifiers: transistor designs and op-amp designs. These are respectively depicted in FIGS. 1(a), 2(a), in block diagram form. In FIG. 2(a), the Voltage Reference sets the Bias Output Voltage (BOV) and provides the circuit with a known voltage point. The Piezo Crystal produces electrical output when induced with physical vibration. It has a capacitance that affects gain and the low-pass corner frequency. R1 also affects low-pass corner; R2 affects the high-pass corner: C1 affects both gain and the low-pass corner; and C2 affects both gain and the high-pass corner. The "corner" frequency is defined as the frequency at which the amplifier AC response varies by ±3 dB from nominal.

Because of the high impedance output of the piezoelectric element, the amplifiers in FIGS. 1(a) and 2(a) must have very high input impedance. High input impedance is achieved by using semiconductor devices (transistors or operational amplifiers) with very low input bias currents and by using large values of resistance, often in the gigaohm range, to bias the amplifier. The high resistances coupled with the capacitance of the piezoelectric element results in very large RC (resistor-capacitor) time constants, where the RC product is the charge time, in seconds. See, for instance, U.S. Pat. Nos. 2,857,462, 3,400,284, and 3,452,287.

The negative effects of op-amp saturation are well known within the industry, such as discussed in Tutorial MT-084 by Analog Devices Corporation, Copyright 2009, and Application Report SLOA067 by Texas Instruments Corporation, Section 4.1, Copyright September 2001. Traditional transistor based designs (FIG. 1(a)) have long startup times, as shown in FIG. 1(b), due to the slow charging of the PZT crystal capacitance through a very large value biasing resistor. Traditional op-amp based designs (FIG. 2(a)) have long startup times, as shown in FIG. 2(b), due to both the slow charging of the piezoelectric element through the large value feedback resistor (R2), and a saturation recovery delay due to the slow feedback's inability to close the loop during startup.

Startup time is an important parameter for many low power piezoelectric sensor applications employing battery power or energy harvesting. The startup time of a piezoelectric amplifier is generally defined as the time it takes from power-up to when the analog output signal has stabilized and the low frequency information is valid. The startup time is related to the bias output voltage (BOV) stabilization (or settling) time, since while the BOV is stabilizing, the low frequency information is contaminated.

The design of a vibration sensor that consumes only microamps of current with a high pass response in the sub Hertz range and a high dynamic range places many constraints on the piezoelectric amplifier design that are incompatible with a fast startup time. Piezoelectric amplifier designs traditionally have had the startup time coupled to the capacitance of the piezoelectric element and the high impedance of the amplifier. In prior art, the low frequency response is set by both the capacitance of the piezoelectric crystal and a large resistance. Since the capacitance of the crystal is small, approximately 1 nF, biasing resistor values have to be large, on the order of a few gigaohms, to place high pass corner frequency into sub-Hertz range. At power up, the capacitance of the piezoelectric sensing element along with other circuitry must be charged through this large resistance before the bias output voltage (BOV) can stabilize. In a traditional piezoelectric amplifier, it can take a few seconds for a sensor to startup and for the BOV to stabilize. For some applications, such as low power wireless sensor networks, this startup time is too long. See, for instance, Connection Technology Center Inc. Model AC 102 data sheet (settling time 2.5 seconds). Connection Technology Center Inc. Model AC 131 data sheet (settling time 2 seconds), and PCB® Piezotronics, Inc. Model 608A11 data sheet (settling time 2.0 seconds).

It will be appreciated that existing piezoelectric amplifier designs have the startup time of the amplifier closely coupled to the high-pass corner frequency. Traditional piezoelectric amplifiers achieve fast startup only by sacrificing low frequency response, low noise characteristics and/or micro power operation. In prior art, a low noise characteristic, micro power operation, sub-Hertz low frequency response and fast startup have been mutually exclusive (unattainable). See FIG. 8, which is a data sheet of a Connection Technology Center Inc. Model AC312, having Sub-Hertz response, micro power, low-noise, but slow startup (1 second). This disadvantage is especially great in low power piezoelectric sensor applications employing battery power or energy harvesting. In many of these applications, only microamps of average current is available and duty cycles (percentage of sensor on-time) are well below one percent. In these cases, the sensor and amplifier must be stabile within milliseconds after the "node" powers up. For instance, see "WirelessHART & Internet Protocol Wireless Sensor Networks Achieve Industry's Lowest Power Consumption at Less Than 50 µA per Node," by Linear Technology Corporation, Oct. 16, 2012.

SUMMARY OF THE INVENTION

The invention proposes a novel biasing scheme that decouples the startup time from the sub-Hertz high-pass corner frequency of the amplifier. As a result, the invention achieves a low current, low voltage, piezoelectric amplifier with sub-Hertz low frequency response, low noise characteristics and fast startup performance.

The present invention eliminates the need to charge the crystal capacitance at power-up. By maintaining the crystal at zero DC bias, extremely fast startup times are achieved. In addition, the present invention does not sacrifice low frequency response. A high-pass cutoff in the sub-Hertz range is maintained. In a further aspect, the present invention provides piezoelectric signal conditioning that consumes only microamps of current while retaining the low noise characteristics of a traditional IEPE (Integrated electronic piezoelectric) amplifier.

These and other objects of the invention, as well as many of the intended advantages thereof, will become more readily apparent when reference is made to the following description, taken in conjunction with the accompanying drawings.

BRIEF DESCRIPTION OF THE FIGURES

FIG. 1(a) is a block diagram of a transistor based piezoelectric amplifier in accordance with the prior art;

FIG. 1(b) is a signal diagram showing the startup time for the circuit of FIG. 1(a);

FIG. 2(a) is a block diagram of an op-amp based piezoelectric amplifier in accordance with the prior art;

FIG. 2(b) is a signal diagram showing the startup time for the circuit of FIG. 2(a):

FIG. 8 shows the parameters of a conventional device; and,

FIG. 9 is a block diagram of an embodiment of the invention.

DETAILED DESCRIPTION OF THE PREFERRED EMBODIMENTS

Figure 3:
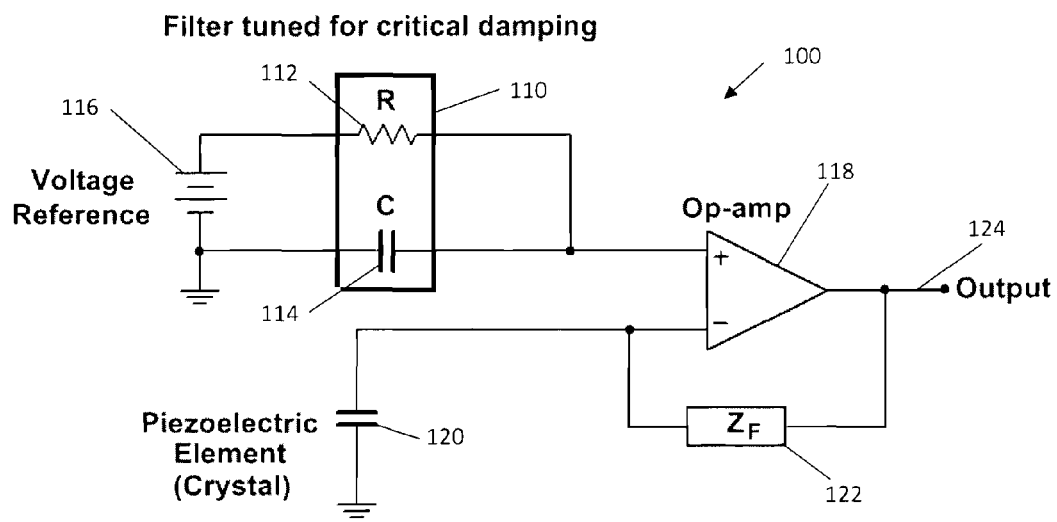
FIG. 3 is a block diagram showing an op-amp circuit in accordance with an embodiment of the present invention.

In describing a preferred embodiment of the invention illustrated in the drawings, specific terminology will be resorted to for the sake of clarity. However, the invention is not intended to be limited to the specific terms so selected, and it is to be understood that each specific term includes all technical equivalents that operate in similar manner to accomplish a similar purpose. Several preferred embodiments of the invention are described for illustrative purposes, it being understood that the invention may be embodied in other forms not specifically shown in the drawings.

A micro power piezoelectric sensor with high dynamic range and a high pass response in the sub Hertz range places many constraints on the piezoelectric amplifier design that are incompatible with a fast startup time. The present invention combines the features of fast startup with low current, low frequency response, and low noise. With the use of a novel biasing technique, it is possible to operate the piezoelectric crystal at zero DC voltage bias, both throughout the startup phase and during normal operation, by setting both ends of the piezoelectric crystal to the same voltage potential. In this application, the potential is that of the reference voltage. Not having to charge the piezoelectric crystal capacitance reduces the startup time dramatically.

Startup times can be reduced by lowering the values of the biasing resistors. This, however, severely reduces the low frequency response of the amplifier. Decoupling the crystal capacitance from the high value biasing resistors preserves the low frequency response of the amplifier. Traditional startup time is approximately equal to 1/high-pass frequency. According to the invention, the startup time can be $1/1000^{th}$ or faster, or at most $1/10^{th}$, of the time derived from an inverse of a high-pass frequency corner.

In accordance with the concepts of the present invention, several illustrative non-limiting embodiments in op-amp based piezoelectric amplifiers are described that significantly reduce startup times from several seconds to the millisecond range.

Embodiment 1

Critically Damped Op-Amp Circuit

Referring to FIG. 3, an op-amp circuit 100 design is shown in accordance with one embodiment of the invention. As shown, the circuit 100 has a delay filter 110, voltage reference 116, op-amp 118, piezoelectric crystal 120, feedback impedance 122, and output 124. The delay filter 110 has a resistor 112 and capacitor 114 arranged in parallel. Thus, one terminal or end of the resistor 112 is connected to the positive of the Voltage reference, one end of the capacitor 114 is connected to the negative side of the Voltage reference, and the second ends of both the resistor 112 and capacitor 114 are joined together at the positive terminal of the op-amp 118.

Op-amp based amplifiers have inherently long startup times due to a saturation recovery delay caused by an open loop behavior during startup. To avoid saturation, the delay filter 110 is placed between the voltage reference 116 and the positive input of the op-amp 118 to critically damp the startup and prevent overshoot. The delay filter 110 is tuned so that the rise in voltage on the non-inverting input of the op-amp 118, during startup, matches the rise in voltage on the inverting input of the op-amp 118. This is accomplished by setting the RC time constant of the delay filter 110 equal to the time constant of the crystal 120 and the feedback impedance 122.

The piezoelectric element 120 is grounded at one end and connected to the negative terminal of the op-amp 118 at the other end. The feedback components 122 can comprise resistive, capacitive or inductive elements. The types and values of the feedback elements can be chosen to tailor the amplifier characteristics (i.e. gain, frequency response, impedance, etc.) to the particular application. The feedback components 122 are connected in such a manner to provide negative feedback. This is accomplished by connecting the feedback components 122 from the output 124 of the op-amp 118 to the inverting input of the op-amp 118 between the piezoelectric element 120 and the op-amp 118.

The rise in voltage on the inverting terminal of the op amp 118 is restricted during startup due to slow charging of the large piezoelectric capacitance 120 through a very large feedback impedance 122. By matching the voltage rise on the non-inverting and inverting inputs of the op-amp 118 during startup, the overshoot and saturation of the output 124 is eliminated. The crystal capacitance 120 is charged through the very large impedance 122 in the feedback loop. The RC time constant of the filter 110 is designed to match the RC time constant of the feedback impedance 122 and the crystal 120. This allows the output 124 of the op-amp 118 to track, at power-up, the slow voltage rise on its inverting input without saturating. The startup time is still determined by the feedback impedance and crystal capacitance time constant. For a crystal 120 with 980 picofarads of capacitance and one gigaohm of feedback resistance, the RC time constant is about one second. Because the output no longer overshoots and suffers from saturation recovery delay, the BOV is able to regulate to normal operating levels quickly. FIG. 1(b) shows the slow, steady ramp up of the BOV. In this case, the BOV takes approximately one second to stabilize.

So in FIG. 3, the delay network 110 has been added to equalize the rate of voltage rise at the op-amp inputs at power up. This is an improvement over FIG. 2(a), where the voltage rise on the positive input of the op-amp is uncompensated. The startup time is improved by preventing the op-amp from becoming saturated during startup (since it takes time for the op-amp to come out of saturation). The startup time remains slow, however, due to the charging time of the crystal capacitance. This makes this circuit suitable only in those applications where the amplifier is always powered on or where startup time is not important.

Embodiment 2

T-Network

Figure 4:
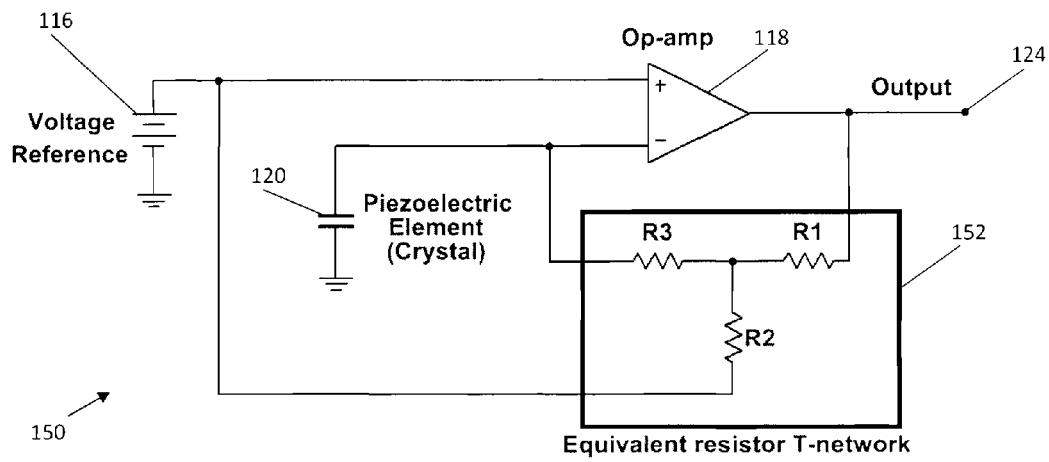
FIG. 4 is a T-network circuit in accordance with an embodiment of the present invention.

Referring to FIG. 4, a T-network circuit 150 is shown with the equivalent effective resistance formula:

$$R_{eff} = R1 \cdot \left(1 + \frac{R2}{R3}\right)$$

The T-network 152 has two resistors R1, R3 connected in series, with a first end of R3 connected to the negative input of the op-amp 118 between the crystal 120 and the op-amp 118. The second end of the resistor R3 is connected to a first end of R1, and the second end of R1 is connected to the output 124 of the op-amp 118. Another resistor R2 has a first end connected between R1 and R3 and a second end connected to the positive input of the op-amp 118 between the voltage reference 116 and the op-amp 118.

Op-amp based charge amplifiers have inherently long startup times as a result of having to charge the piezoelectric capacitance through large value (>one gigaohm) feedback resistors. Substituting a resistor T-network 152 in the negative feedback of the operational amplifier 118 provides an equivalent gain resistance for steady state operation while allowing higher currents to quickly charge the piezoelectric crystal capacitance 120 during startup. The resistance values in the T-network 152 are typically an order of magnitude less than the effective resistance they generate. During startup, the T-network 152 provides a low resistance changing path from the op-amp output 124 and from the voltage reference 116. By charging the piezoelectric capacitance through the T-network 152, the BOV is able to regulate to normal operating levels quickly. It is further noted that the present Embodiment 2 can be combined with Embodiment 1 above.

An advantage that FIG. 4 has over FIG. 3 is that the effective total impedance of the feedback network can be varied without affecting overall gain. Since R2 and R3 are usually small in value compared to R1, a low impedance path exists between the voltage reference and the crystal, allowing the crystal capacitance to charge at a faster rate. This results in faster startup times. This complex feedback network can be employed in high gain precision amplifier configurations to reduce the effects of leakage and input bias currents. Thus, FIG. 4 charges the crystal capacitance through a lower effective feedback resistance, as accomplished by the T-network. This faster charging of the crystal reduces the startup time.

Embodiment 3

Zero Crystal Bias

In the prior art, op-amp based piezoelectric amplifiers have had inherently long startup times as a result of having to charge the piezoelectric element capacitance to a non-zero voltage level. In a traditional circuit such as those shown in FIGS. 1(a), 2(a), the non-output side of the crystal is grounded (zero volt potential). This requires the circuit to charge the piezoelectric crystal to a non-zero bias voltage through a large feedback resistance. After power-up, this leads to long BOV stabilization times.

Figure 5A:
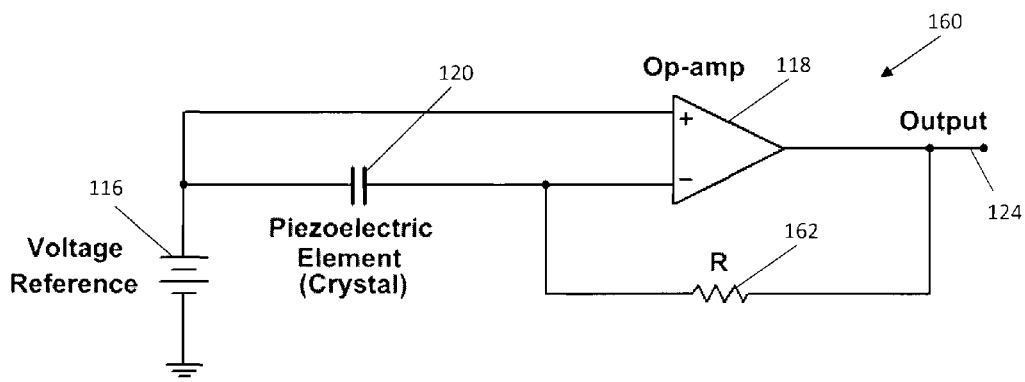
FIG. 5(a) is a reverse charge-up circuit.
Figure 5B:
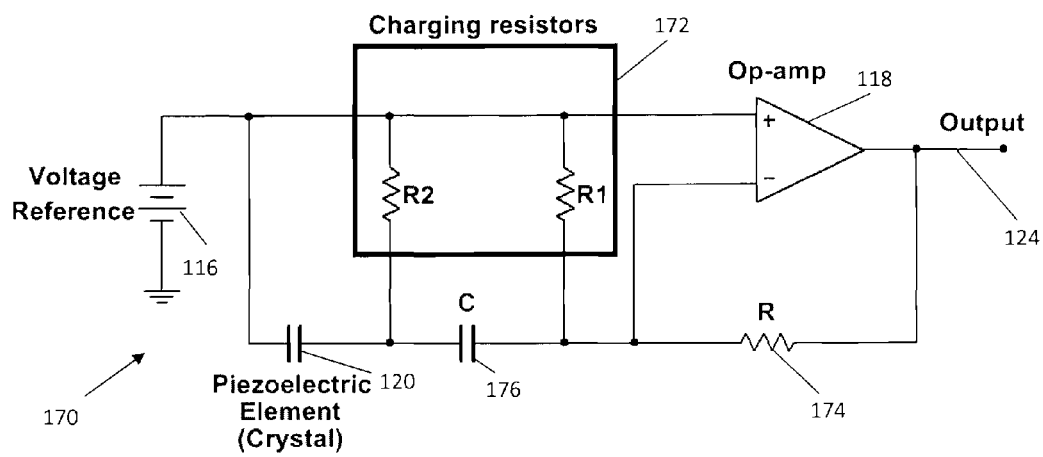
FIG. 5(b) is a bootstrap charging circuit.
Figure 5C:
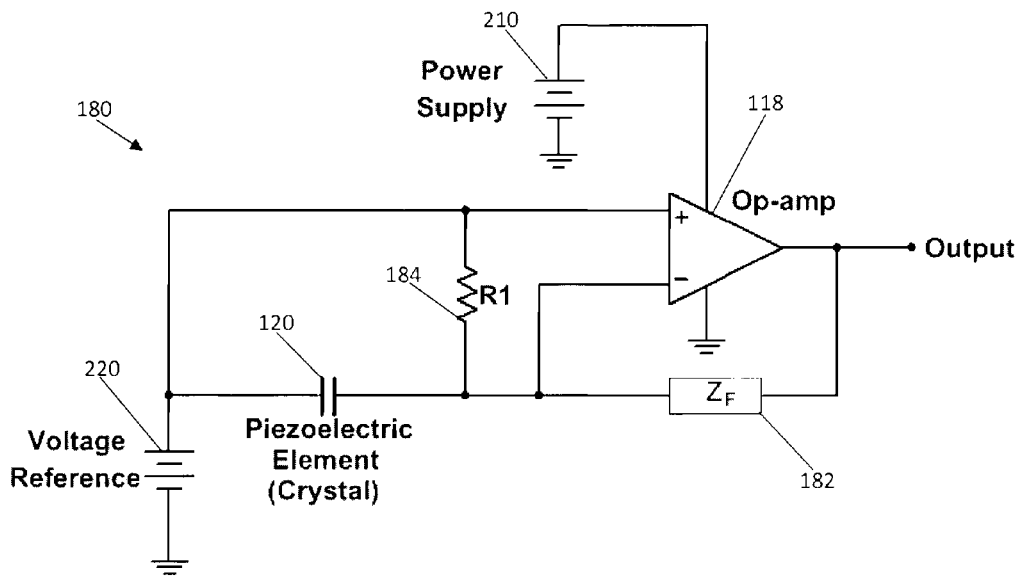
FIG. 5(c) is reverse charge-up with bootstrap circuit.

Referring to FIGS. 5(a)-(c), three different circuit configurations that eliminate DC bias on the crystal are shown. The present invention shows it is possible to operate the piezoelectric crystal 120 at zero voltage bias, by setting both ends of the piezoelectric crystal 120 to the reference voltage 116 potential, both throughout the startup phase and during normal operation. Even though the absolute values of the voltages on each end of the crystal are increasing, the voltage differential across the piezoelectric element 120 remains zero. This avoids having to charge the piezoelectric crystal capacitance, thereby reducing the startup time dramatically.

Three illustrative, non-limiting approaches of achieving zero-DC crystal bias are shown in FIGS. 5(a)-(c). FIG. 5(a) shows a reverse charge up topology 160. Instead of connecting the crystal 120 to ground, the crystal 120 is biased at the reference voltage 116. Accordingly, the crystal 120 has one end connected to the voltage reference 116 and a positive input of the op-amp 118. An opposite end of the crystal 120 is connected to the negative input of the op-amp 118, with a resistance 162 between the crystal 120 and the op-amp 118. An opposite end of the resistance 162 is connected to the output 124. The resistance 162 is connected to provide negative feedback, thus closing the feedback loop.

FIG. 5(b) shows a bootstrap circuit 170. The bootstrap paths 172 are included from the voltage reference 116 to both sides of the piezoelectric crystal 120. The bootstrap elements 172 can be resistors or capacitors. Here, the resistors 172 are shown as two resistors R1, R2. A first end of each resistor R1, R2 is connected to the voltage reference, the piezoelectric element 120, and to the positive terminal of the op-amp 118. The opposite ends of the resistors R1, R2 are connected across a capacitor 176. Resistor R2 is connected between the piezoelectric crystal 120 and the voltage reference. Resistor R1 is connected between the capacitor 176 and the non-inverting input of the op-amp 118. The output 124 of the op-amp 118 connects back to the inverting input of the op-amp 118 through a resistor 174. Resistor R2 provides a DC path to the non-reference terminal of the crystal, thus holding the crystal at zero DC bias. Resistor R1 completes the DC path around the capacitor 176, thus holding the capacitor 176 at zero DC bias. The resistor 174 completes the negative feedback loop of the op-amp.

To minimize component count, the reverse charge up configuration of FIG. 5(a) may be combined with the bootstrap configuration of FIG. 5(b). This topology is shown in FIG. 5(c). As shown here, the piezoelectric element 120 is connected in parallel with the resistor 184, with the first end of each connected to the positive input of the op-amp 118, and a second end of each connected to the inverting input of the op-amp 118. The output of the op-amp 118 also connects with the inverting terminal of the op-amp 118 through an impedance 182.

FIG. 5(c) shows a reverse charge-up with bootstrap circuit 180. The circuit of FIG. 5(c) achieves the goals of the invention with minimal component count. Resistor R1 provides a DC path around the crystal 120 to hold the crystal at zero DC bias. During power-up and during normal operation, both sides of the crystal 120 are maintained at equal DC voltage, eliminating the requirement to charge the crystal capacitance. Impedance 182 is required to complete the negative feedback loop of the amplifier. It may comprise resistive or reactive components whose values can be adjusted to meet the gain and frequency response requirements.

Figure 5D:
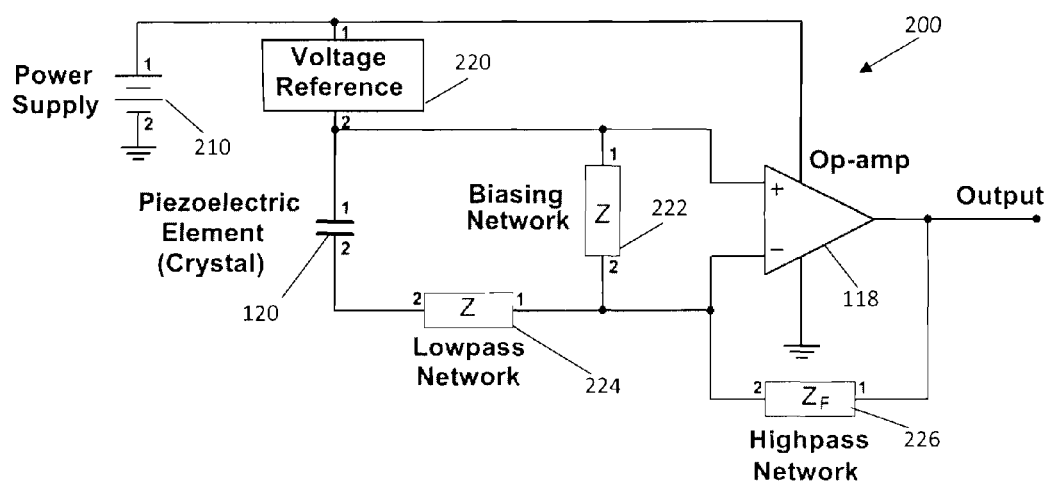
FIG. 5(d) is the circuit of FIG. 5(c) with low-pass and high-pass filtering.

Turning to FIG. 5(d), components that perform low-pass and high-pass filtering 224, 226 have been added. This is the final, preferred circuit topology for Embodiment 3. It is further noted that Embodiment 3 can be combined with Embodiments 1 and/or 2 above. As shown in FIG. 5(d), the invention can be a circuit 200 that has a power supply 210 and a voltage reference 220. The power supply 210 provides a source of filtered and regulated DC voltage for the amplifier circuit. The voltage reference 220 provides a low-noise, tightly regulated voltage with a nominal value of one-half of the power supply 210 voltage. Both the power supply 210 and voltage reference 220 are ground referenced.

The circuit 200 has a piezoelectric element 120, biasing network 222, low-pass network 224, high-pass network 226 and op-amp 118. The piezoelectric crystal 120 has a first end connected to the voltage reference, biasing network and the op-amp positive input. The second end is connected to the input of the low-pass network. The biasing network 222 has a first end connected to the first end of the piezoelectric crystal 120, the voltage reference and the op-amp positive input. The biasing network second end is connected to the output of the low-pass network, the negative op-amp input and the high-pass network 226. The low-pass network 224 has a first end connected to the second end of the biasing network 222 and a second end connected to the second end of the piezoelectric crystal 120. The op-amp 118 has a positive input connected to the first end of the piezoelectric crystal 120, the second end of the voltage reference 220, and the first end of the biasing network 222, a negative input connected to the second end of the biasing network 222, the first end of low-pass network 224, and the second end of the high-pass network 226. The high-pass network 226 has a first end connected to the output of the op-amp 118, and a second end connected to the negative input of the op-amp 118, the second end of the biasing network 222 and the first end of the low-pass network 224.

In addition, the reference voltage 220 has a first end that is connected to the power supply 210 and a second end that is applied to the first end of the piezoelectric element 120, the second end of the biasing network, and the positive input of the op-amp 118. The op-amp 118 has a positive supply voltage from the power supply 210 and is ground referenced. The biasing circuit 222 provides a same voltage potential at the first and second ends of the piezoelectric crystal 120. The first end of the crystal 120 is connected to Vref, and a DC path is provided to connect the Vref with the second end of the crystal and low-pass network.

In operation, the voltage reference 220 sets the DC operating point of the op-amp 118. To achieve maximum output voltage swing, the DC operating point is usually set at one-half the power supply 210 voltage. The biasing network 222 may comprise both resistive and reactive components. Biasing network resistive elements are essential to complete the DC path from the voltage reference 220 to the first end of the low-pass network 224. Maintaining the crystal 120 and the low-pass network 224 at the same DC bias eliminates the need to charge the crystal capacitance. The low-pass network 224 may comprise both resistive and reactive components and sets the low-pass corner of the amplifier 118. The high-pass network 226 may comprise both resistive and reactive components. In addition to closing the negative feedback loop of the op-amp 118, the high-pass network 226 also sets the high-pass corner of the amplifier 118.

Thus, each of FIGS. 5(a), 5(b), 5(c), and 5(d) can be implemented separately, as may be appropriate to the specific application. FIG. 5(a) is the most basic configuration of the amplifier. It is DC coupled (no capacitor between the crystal and the op-amp), but does not include any frequency selective components, such as high-pass or low-pass filters, that would allow the user to tailor the frequency response. FIG. 5(b) adds AC coupling to enable filtering, by providing a capacitor 176, and R1 and R2 172 are provided to maintain the zero voltage across both the crystal 120 and the capacitor 176 by providing bias paths for those elements. FIG. 5(c) is a bit simplified by replacing R1 and R2 of FIG. 5(b) with a single R1 184. FIG. 5(d) adds high-pass and low-pass filtering 224, 226 to FIG. 5(c), so that the circuit is frequency selective.

CONCLUSION

With the three illustrative embodiments outlined above with respect to FIGS. 3-5, the startup time of a piezoelectric amplifier is reduced to less than 5 milliseconds while still preserving other important circuit characteristics. The supporting data in FIGS. 6-7 is from a sensor containing a piezoelectric amplifier using the "reverse charge up with bootstrap" embodiment shown in FIG. 5(c) (though would also apply to FIG. 5(d)).

Figure 6:
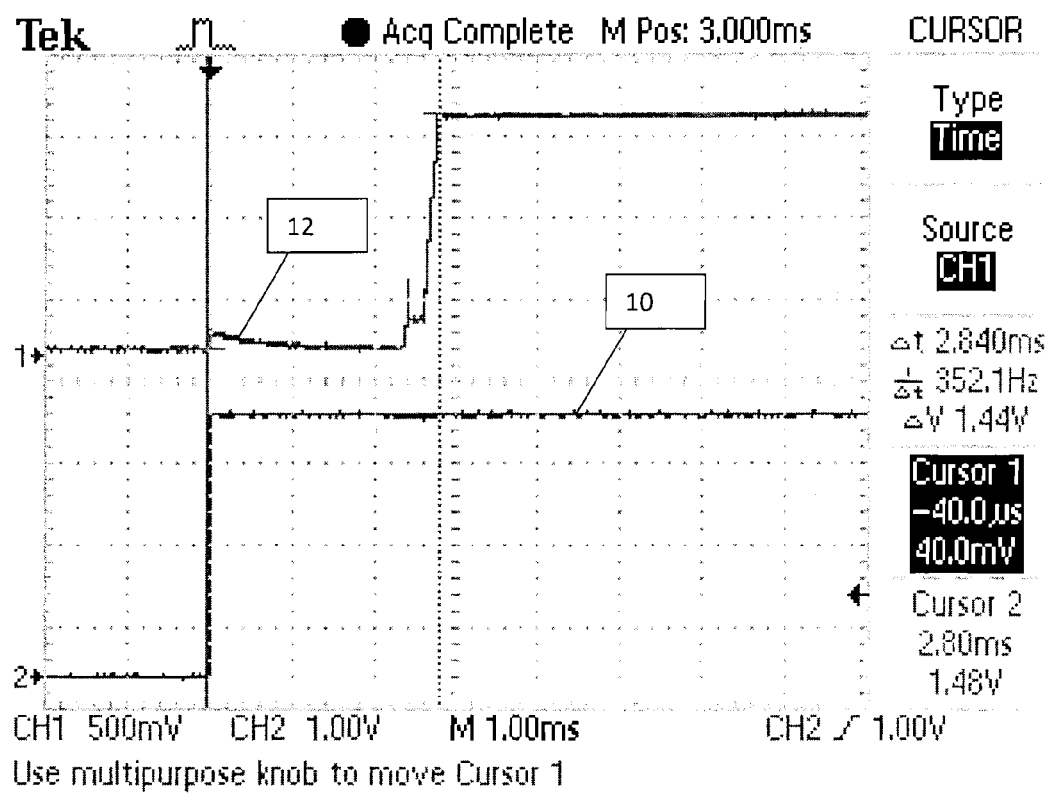
FIG. 6 is a trace showing the BOV stabilizing, with no acceleration (vibration) present, for the circuit of FIG. 5(c)

More specifically, FIG. 6 is a captured oscilloscope measurement for the circuit of FIG. 5(c), that shows the startup time of the sensor with no acceleration present. Vertical scale (voltage) is 1 volt/division. Horizontal scale (time) is one millisecond per division. The lower trace 10 is the power supply voltage 210 (FIG. 5(c)) as applied to the sensor. The input voltage is a step function with extremely fast rise time and magnitude of 3.3V. The upper trace 12 is the output of the sensor (output of the op-amp 118). Trace 12 shows the BOV stabilizes at 3 volts DC within 3 milliseconds after power is applied to the sensor.

Figure 7:
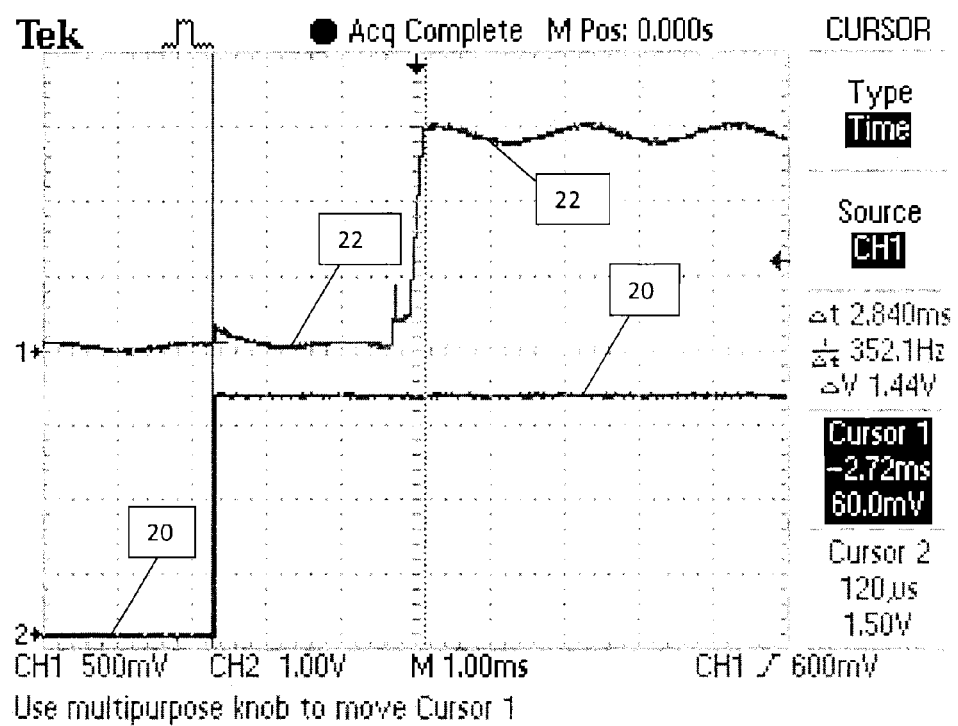
FIG. 7 is a trace showing the BOV stabilizing, with sinusoidal acceleration (vibration) present, for the circuit of FIG. 5(c)

FIG. 7 is a captured oscilloscope measurement for the circuit of FIG. 5(c), that shows the startup time and output waveform of the sensor with sinusoidal acceleration present. Vertical scale (voltage) is 1 volt/division. Horizontal scale (time) is one millisecond per division. The lower trace 20 is the power supply voltage 210 (FIG. 5(c)) as applied to the sensor. The input voltage is a step function with extremely fast rise time and a magnitude of 3.3V. The upper trace 22 is the output of the sensor (output of the op-amp 118). The trace 22 shows the BOV stabile at 3 volts DC with sinusoidal acceleration AC component present within 3 milliseconds after power is applied to the sensor.

The sensor (piezoelectric amplifier and piezoelectric crystal combination) meets the following performance characteristics: start up <5 ms; current consumption <500 uA; low frequency response of −3 dB at <0.3 Hz; low noise and a dynamic range of 89 dB (where dynamic range is defined as the range between the largest and smallest levels the sensor can measure). Other sensor specifications are: a piezoelectric crystal capacitance of 800 pF, an operating temperature range of −40° C. to +120° C., and an input supply voltage range of 3-30 V DC.

Typical 5 millisecond startup of final piezoelectric amplifier is shown in FIG. 6 (reference numeral 10 is power and 12 is BOV stabilization). Trace 12 shows the BOV stabilizing within 3 milliseconds after power is applied to the circuit. In FIG. 7, trace 12 shows the same startup stabilization with an input signal on the amplifier from the sensors piezoelectric crystal (vibration sensor). Both the BOV and the vibration measurement are available within several milliseconds.

The present invention can be utilized in a wide variety of applications. For instance. FIG. 9 shows the present invention implemented as a piezoelectric accelerometer. As shown, a mass 302 is connected to a piezoelectric crystal 306 via a beam 304. The crystal 306, in turn, is connected to the piezoelectric amplifier 308 (i.e., the present invention), which provides an amplified output. The figure shows the basic components of a typical piezoelectric accelerometer: a mass 302 supported by a beam suspension 304 attached to a piezoelectric element (crystal) 306. Under acceleration the mass 302 deflects and loads the piezoelectric element 306. The force exerted on the crystal 306 causes a charge or voltage to be generated by the piezoelectric material.

Accordingly, a piezoelectric amplifier with low current consumption, low frequency response, and low noise can be achieved through judicious selection of discrete components. For an op-amp, the key characteristics, in addition to low power consumption, are low input bias current, low noise, high slew rate, and high gain bandwidth product. While lowering the power consumption also increases the startup time, it is possible to select components with millisecond startup that still have the key characteristics required.

Noise performance characteristics are paramount for power supply (voltage regulator) and voltage reference components. The invention is able to achieve a very low noise amplifier by careful selection of only those components of the "ultralow noise" type. Extended low frequency response concurrent with fast startup is achieved through the use of a novel biasing scheme that decouples the startup time from the high-pass corner.

The low frequency response is driven by the capacitance of the piezoelectric crystal and the gigaohm feedback resistor. The larger the feedback resistor, the lower the frequency response, but also the slower the startup. In a traditional op-amp piezoelectric amplifier, it is not possible to have both extremely low frequency response and fast startup.

The present invention provides a fast startup while preserving the other electrical characteristics. It should further be noted that the piezoelectric amplifier design of the present invention can either be stand alone or combined in an integrated package with a piezoelectric sensing element. Thus, the piezoelectric amplifier can be used with remotely wired piezoelectric sensing elements, and can be integrated with elements to form a complete sensor.

It is further noted that the same numerals have been used to refer to a number of common elements in the various illustrative embodiments of the invention. For instance, reference numeral 116 is used to refer to the reference voltage, and 118 is used to refer to the op-amp. However, it should be recognized that those elements need not be identical and for instance can differ in structure and value.

As discussed herein, a zero voltage bias is provided across the piezoelectric crystal, whereby the DC voltage across the crystal is zero (0.0 volts). The crystal generates an AC voltage that is superimposed on the DC voltage on the crystal. The AC voltage is amplified, as shown in FIG. 7, whereby reference 22 shows an output with the AC waveform riding on top of the BOV. A zero voltage bias minimizes the startup time since the crystal does not need to be charged. Accordingly, it is desired to minimize the voltage differential to keep as close to a zero differential as possible (to thereby minimize the startup time). However, it will be appreciated that other voltage differentials will also result in faster startup by reducing the amount of charging needed by the crystal, and still be within the spirit and scope of the invention, depending on the application. Thus, while a zero voltage differential results in the minimum startup time, a reduced startup time can be achieved with a greater-than-zero voltage differential.

As used herein, the term "network" and "circuit" are used interchangeably. The network can include one or more components. For instance, the biasing network can be a resistor, but can be one or more resistors, inductors, or capacitors.

The foregoing description and drawings should be considered as illustrative only of the principles of the invention. The invention may be configured in a variety of ways and is not intended to be limited by the preferred embodiment. Numerous applications of the invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

The invention claimed is:

1. A circuit comprising:
   a piezoelectric element having a first end and a second end; and,
   a biasing circuit connected to the first end and the second end of said piezoelectric element, said biasing circuit providing a first voltage potential at the first end of said piezoelectric element and a second voltage potential at the second end of said piezoelectric element, wherein the first voltage potential and the second voltage potential are the same or substantially the same so that a voltage differential between the first voltage potential and the second voltage potential is zero or substantially zero, wherein said biasing circuit provides the same voltage potential at the first end and the second end of said piezoelectric element.

2. The circuit of claim 1, further comprising an amplifier, wherein said biasing circuit provides a startup time of said piezoelectric element that is faster than a startup time of the amplifier.

3. The circuit of claim 2, wherein the startup time of said amplifier is at most 1/10th the time derived from an inverse of a high-pass corner frequency.

4. The circuit of claim 3, further comprising an amplifier and a power supply configured for providing a supply current to the amplifier, wherein the supply current is less than 500 uA.

5. The circuit of claim 4, wherein a low frequency response of the circuit is −3 dB at 0.3 Hz or lower.

6. The circuit of claim 5, wherein the amplifier is coupled to the piezoelectric element, and wherein a dynamic range of the amplifier and the piezoelectric element is at least 80 dB.

7. The circuit of claim 6, wherein said piezoelectric element comprises a piezoelectric crystal with a capacitance of greater than 200 pF.

8. The circuit of claim 7, wherein said circuit has an operating temperature range of at least −20° C. to +85° C.

9. The circuit of claim 8, wherein said circuit has a supply voltage of 3-30 VDC.

10. The circuit of claim 1, wherein said biasing circuit operates said piezoelectric element at zero DC voltage bias during both startup phase and normal operation.

11. The circuit of claim 1, wherein said biasing scheme avoids charging the piezoelectric element's capacitance.

12. The circuit of claim 1, wherein a voltage differential across the piezoelectric element is zero or substantially zero.

13. A circuit comprising:
   a piezoelectric element having a first end and a second end; and,
   a biasing circuit connected to the first end and the second end of said piezoelectric element, said biasing circuit providing a first voltage potential at the first end of said piezoelectric element and a second voltage potential at the second end of said piezoelectric element, wherein the first voltage potential and the second voltage potential are the same or substantially the same so that a voltage differential between the first voltage potential and the second voltage potential is zero or substantially zero, wherein said biasing circuit has a first end connected to the first end of the piezoelectric element, and a second end; and a low-pass network having a first end connected to the second end of said biasing circuit and a second end connected to the second end of the piezoelectric element.

14. The circuit of claim 13, further comprising:

an op-amp having a positive input connected to the first end of said piezoelectric element and the first end of said biasing circuit, a negative input connected to the second end of said biasing circuit and the first end of said low-pass network.

15. The circuit of claim 14, further comprising:

a high-pass network having a first end connected to an output of said op-amp, and a second end connected to the negative input of said op-amp, the second end of said biasing circuit, and the first end of said low-pass network.

16. The circuit of claim 15, further comprising:

a reference voltage having a first end and a second end applied to the first end of said piezoelectric element, the first end of said biasing circuit, and the positive input of said op-amp; and a positive voltage applied to the op-amp and to the first end of said reference voltage.

17. A circuit comprising:

a piezoelectric element having a first end and a second end; and, a biasing network having a first end directly connected to the first end of the piezoelectric element, and a second end;

an op-amp having a positive input directly connected to the first end of said piezoelectric element and the first end of said biasing network, a negative input directly connected to the second end of said biasing network; and a high-pass network having a first end directly connected to an output of said op-amp, and a second end directly connected to the negative input of said op-amp and the second end of said biasing network;

wherein a same voltage potential is provided at the first end and the second end of said piezoelectric element.

18. The circuit of claim 17, whereby the op-amp has an output, and stabilization of the op-amp output is decoupled from characteristic frequency of the high-pass filter.

19. The circuit of claim 18, where stabilization is achieved through minimal DC bias on the piezoelectric element.

20. The circuit of claim 17, further comprising:

a low-pass network having a first end directly connected to the second end of said biasing network and a second end directly connected to the second end of the piezoelectric element;

wherein the negative input of said op-amp is connected to the first end of the low-pass network, and the second end of said high-pass network is directly connected to the first end of said low-pass network.

21. The circuit of claim 17, further comprising:

a reference voltage directly applied to the first end of said piezoelectric element, the first end of said biasing network, and the positive input of said op-amp; and a positive voltage directly applied to the op-amp and the first end of said reference voltage.

22. The circuit of claim 17, said biasing circuit providing a same or substantially same voltage potential at the first end and the second end of said piezoelectric element.

* * * * *